United States Patent
Park et al.

(10) Patent No.: US 7,863,677 B2
(45) Date of Patent: Jan. 4, 2011

(54) SEMICONDUCTOR DEVICE AND METHOD OF FABRICATING THE SAME

(75) Inventors: Jong-Chul Park, Suwon-Si (KR); Sang-Sup Jeong, Suwon-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 225 days.

(21) Appl. No.: 12/212,356

(22) Filed: Sep. 17, 2008

(65) Prior Publication Data

US 2009/0079012 A1    Mar. 26, 2009

(30) Foreign Application Priority Data

Sep. 18, 2007    (KR) .................. 10-2007-0094908

(51) Int. Cl.
*H01L 29/66*    (2006.01)

(52) U.S. Cl. .................. 257/331; 438/578; 438/586; 438/587; 257/E21.555; 257/E21.621; 257/E21.624; 257/E21.635; 257/E21.638; 257/E27.06; 257/E21.177; 257/E21.653; 257/E39.005; 257/E33.005; 257/E33.065

(58) Field of Classification Search .................. 438/578
See application file for complete search history.

(56) References Cited

U.S. PATENT DOCUMENTS 6,255,170 B1 * 7/2001 Yu .......................... 438/264

FOREIGN PATENT DOCUMENTS

| JP | 03-274760 | 12/1991 |
|---|---|---|
| JP | 05-326886 | 12/1993 |
| KR | 100135695 | 1/1998 |
| KR | 1020050065849 | 6/2005 |

* cited by examiner

*Primary Examiner*—Savitri Mulpuri
*Assistant Examiner*—Yasser A Abdelaziez
(74) *Attorney, Agent, or Firm*—F. Chau & Associates, LLC

(57) ABSTRACT

A semiconductor device and a method of fabricating the same are provided. The semiconductor device includes a plurality of active regions which are defined in a semiconductor substrate, a plurality of gate lines which are formed as zigzag lines, extend across the active regions, are symmetrically arranged, and define a plurality of first regions and a plurality of second regions therebetween, and wherein the first regions being narrower than the second regions. The semiconductor device further includes an insulation layer which defines a plurality of contact regions by filling empty spaces in the first regions between the gate lines and, extending from the first regions, and surrounding sidewalls of portions of the gate lines in the second regions, and wherein the contact regions partially exposing the active regions and a plurality of contacts which respectively fill the contact regions.

17 Claims, 10 Drawing Sheets

SEMICONDUCTOR DEVICE AND METHOD OF FABRICATING THE SAME

CROSS-REFERENCE TO RELATED APPLICATION

This application claims priority from Korean Patent Application No. 10-2007-0094908 filed on Sep. 18, 2007, the disclosure of which is hereby incorporated by reference herein in its entirety.

BACKGROUND OF THE INVENTION

1. Technical Field

The present disclosure relates to a semiconductor device and to a method of fabricating the same, and, more particularly, to a semiconductor device and to a method of fabricating the same in which the contact areas of contacts can be increased and the fabrication of a semiconductor device can be simplified.

2. Description of the Related Art

Generally, semiconductor devices include individual elements such as transistors or capacitors and interconnections which connect such individual elements. Semiconductor devices may also include contacts which connect individual elements to each other, connect individual elements to interconnections, or connect interconnections to other interconnections.

To be in line with the increasing integration density of semiconductor devices, the size of individual elements of semiconductor devices are decreasing, and thus both the size and margin of contacts that connect individual elements to each other or connect upper interconnections to lower interconnections are decreasing.

In view of the foregoing, there is a need in the art for a semiconductor device and to a method of fabricating the same in which the contact areas of contacts can be increased and the fabrication of a semiconductor device can be simplified.

SUMMARY OF THE INVENTION

Exemplary embodiments of the present invention may provide a semiconductor device and to a method of fabricating the same in which the contact areas of contacts can be increased and the fabrication of a semiconductor device can be simplified.

In accordance with an exemplary embodiment of the present invention, a semiconductor device is provided. The semiconductor device includes a plurality of active regions which are defined in a semiconductor substrate, a plurality of gate lines which are formed as zigzag lines, extend across the active regions, are symmetrically arranged, and define a plurality of first regions and a plurality of second regions therebetween, wherein the first regions are narrower than the second regions. The semiconductor device further includes an insulation layer which defines a plurality of contact regions by filling empty spaces in the first regions between the gate lines and, extending from the first regions, and surrounding sidewalls of portions of the gate lines in the second regions, and wherein the contact regions partially exposing the active regions and a plurality of contacts which respectively fill the contact regions.

In accordance with an exemplary embodiment of the present invention, a semiconductor device is provided. The semiconductor device includes a plurality of active regions which are defined in a semiconductor substrate, a plurality of gate lines which extend across the active regions, each of the gate lines including a plurality of protrusions and a plurality of recesses that are alternately formed on either side of a corresponding gate line and are asymmetrical with respect to a longitudinal direction of the gate lines. In addition, at least one of protrusions or the recesses of a gate line corresponding to at least one of the respective protrusions or the respective recesses of an adjacent gate line. The semiconductor device further includes an insulation layer which is formed on sidewalls of each of the gate lines and includes first portions that fill empty spaces between the protrusions and second portions that define a plurality of contact regions by extending from the first portions, surrounding sidewalls of the recesses, and partially exposing the active regions and a plurality of contacts which respectively fill the contact regions.

In accordance with an exemplary embodiment of the present invention, a method of fabricating a semiconductor device is provided. The method includes defining a plurality of active regions in a semiconductor substrate, forming a plurality of gate lines as zigzag lines, the gate lines extending across the active regions, being symmetrically arranged and defining first regions and second regions therebetween, and wherein the first regions being narrower than the second regions. The method further includes forming an insulation layer which defines a plurality of contact regions by filling empty spaces in the first regions between the gate lines and, extending from the first regions, and surrounding sidewalls of portions of the gate lines in the second regions, wherein the contact regions partially exposing the active regions and forming a plurality of contacts so that the contact regions are filled with the respective contacts.

In accordance with another exemplary embodiment of the present invention, a method of fabricating a semiconductor device is provided. The method includes defining a plurality of active regions in a semiconductor substrate, forming a plurality of gate lines, each of the gate lines including a plurality of protrusions and a plurality of recesses that are alternately formed on either side of a corresponding gate line and are asymmetrical with respect to a longitudinal direction of the gate lines and wherein at least one of the protrusions or the recesses of a gate line corresponding to at least one of the respective protrusions or the respective recesses of an adjacent gate line. The method further includes forming an insulation layer on sidewalls of each of the gate lines, the insulation layer including first portions that fill empty spaces between the protrusions and second portions that define a plurality of contact regions by extending from the first portions, surrounding sidewalls of the recesses, and partially exposing the active regions and forming a plurality of contacts so that the contact regions are filled with the respective contacts.

BRIEF DESCRIPTION OF THE DRAWINGS

Exemplary embodiments of the present invention can be understood in more detail from the following description taken in conjunction with the attached drawings, in which.

DETAILED DESCRIPTION OF THE EXEMPLARY EMBODIMENTS OF THE INVENTION

Figure 1:
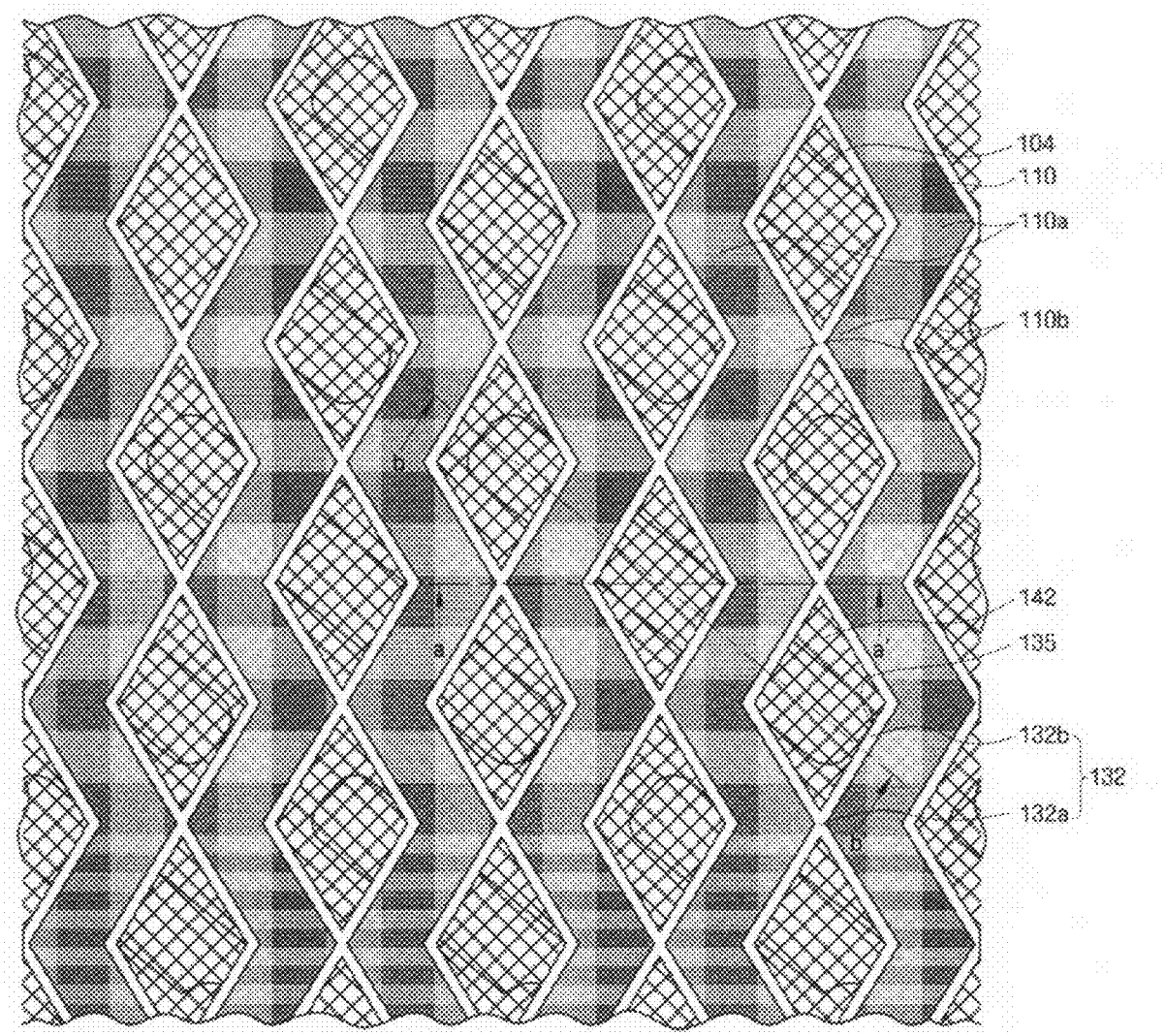
FIG. 1 illustrates a plan view of a semiconductor device according to an exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art. The size of layers and regions shown relative to each other in the drawings may be exaggerated for the clarity of illustration.

It will be understood that when an element or a layer is referred to as being "on" or "above" another element or layer, it can be directly on or above the other element or layer or intervening elements or layers may be present. In contrast, when an element or a layer is referred to as being "directly on" or "directly above" to another element or layer, there are no intervening elements or layers present. As used herein the term "and/or" includes any and all combinations of one or more of the associated listed items.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below. Like numbers refer to like elements throughout.

Exemplary embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing.

The structure of a semiconductor device according to an exemplary embodiment of the present invention will hereinafter be described in detail with reference to FIGS. 1, 2A and 2B.

Figure 2A:
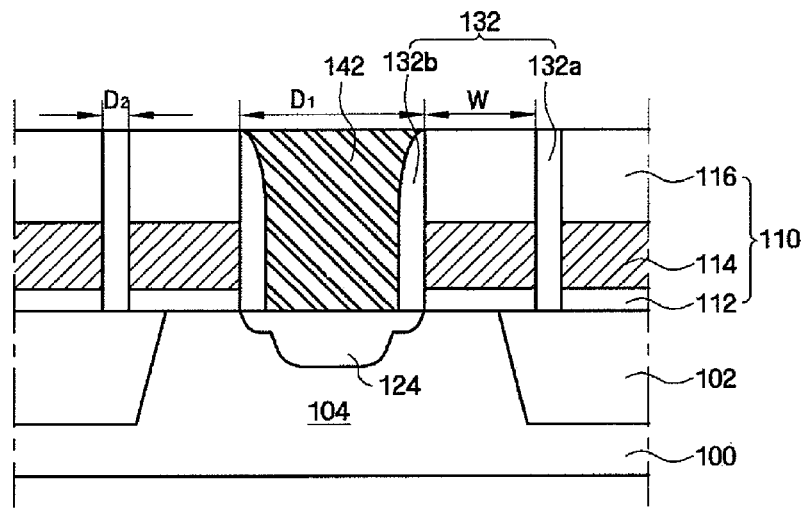
FIGS. 2A and 2B illustrate cross-sectional views taken along lines a-a' and b-b', respectively, of FIG. 1.
Figure 2B:
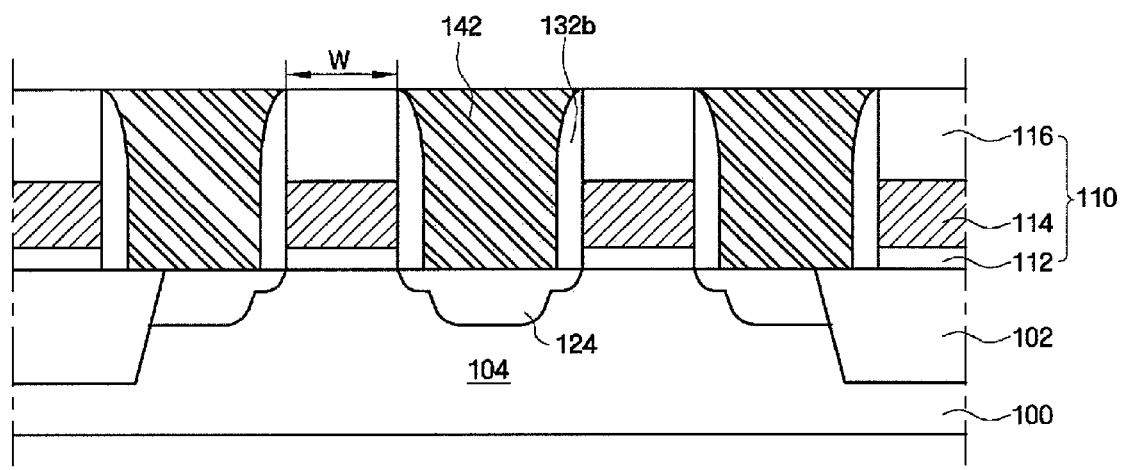

FIG. 1 illustrates a plan view of a semiconductor device according to an exemplary embodiment of the present invention, and FIGS. 2A and 2B illustrate cross-sectional views taken along lines a-a' and b-b', respectively, of FIG. 1. Referring to FIGS. 1, 2A and 2B, a plurality of active regions 104 are defined in a semiconductor substrate 100 as diagonal bars by an isolation layer 102. The active regions 204 may form, for example, a predetermined angle $\theta$ (where $0<\theta<\pm 90$) with a longitudinal direction of a plurality of gate lines 210.

The gate lines 210 are disposed on the semiconductor substrate 100 and extend across the active regions 104. As the active regions 104 are diagonally arranged, some channel portions in the active regions 104 below the gate lines 110 may have an angle of, for example, about 90° or less. In this case, an electromagnetic field may be concentrated in these channel portions during an operation of the semiconductor device.

Therefore, the gate lines 110 may be formed as, for example, zigzag lines so that each of the gate lines 110 can extend across two active regions 104, and can include a plurality of first protrusions 110a and a plurality of second protrusions 110b. The gate lines 110 have a predetermined width W.

Each of the gate lines 110 includes the first protrusions 110a and the second protrusions 110b, which are alternately arranged along a corresponding gate line 110. That is, the second protrusions 110b are disposed between respective corresponding pairs of vertically adjacent first protrusions 110a. Likewise, the first protrusions 110a are disposed between respective corresponding pairs of vertically adjacent second protrusions 110b. The first protrusions 110a protrude in the direction opposite to the second protrusions 110b.

The gate lines 110 are disposed a predetermined distance apart from one another so that a pair of adjacent gate lines 110 can become symmetrical. Therefore, a plurality of first regions and a plurality of second regions may be defined between the pair of adjacent gate lines 110. The distance between the pair of adjacent gate lines 110 is greater in the second regions than in the first regions.

That is, as the gate lines 110 are symmetrically arranged, the distance between the pair of adjacent gate lines 110 increases from a second distance $D_2$ to a first distance $D_1$ in the second regions, and decreases from the first distance $D_1$ to the second distance $D_2$ in the first regions. The first distance $D_1$ is the distance between a pair of horizontally adjacent first protrusions 110a, and the second distance $D_2$ is the distance between a pair of adjacent second protrusions 110b.

The distance between the pair of horizontally adjacent second protrusions 110b, e.g., the second distance $D_2$, may be determined so that the empty space between the pair of adjacent second protrusions 110b can be completely filled with an insulation layer 132. The first regions are disposed on the isolation layers 102.

As the gate lines 110 are formed as zigzag lines, the active regions 104 are partially exposed between the gate lines 110, and particularly between the first protrusions 110a where the pair of adjacent gate lines 110 is maximized.

Each of the gate lines 110 includes a gate insulation layer 112, a gate conductive layer 114 and a gate capping layer 116 which are sequentially deposited on the semiconductor substrate 100. Impurity regions 124 are formed in the active regions 104 on both sides of each of the gate lines 110. That is, the impurity regions 124 are disposed between the first protrusions 110a where the distance between the pair of adjacent gate lines 110 is maximized.

The insulation layer 132 is formed on both sidewalls of each of the gate lines 110. The insulation layer 132 may include a plurality of barrier layers 132a disposed in the first regions between the second protrusions 110b and a plurality of pairs of spacers 132b disposed in the second regions between the first protrusions 110b.

For example, the empty spaces between the second protrusions 110b may be completely filled with the barrier layers 132a because the distance between the pair of adjacent gate lines 110 is minimized between the second protrusions 110b. The pairs of spacers 132b are formed on the sidewalls of the gate lines 110 between the first protrusions 110a where the distance between the pair of adjacent gate lines 110 is maximized. The pairs of spacers 132b are connected to the barrier layers 132a. The pairs of spacers 132b are conformally formed along the sidewalls of the gate lines 110. A pair of adjacent spacers 132b belonging to different gate lines 110 face each other, and the distance between the pair of adjacent spacers 132b increases or decreases according to the shapes of the different gate lines 110.

The pairs of spacers 132b are connected to the barrier layers 132a, and expose the impurity regions 124, thereby defining a plurality of contact regions 135. As the gate lines 110 are formed as zigzag lines and are symmetrically arranged, the areas of the impurity regions 124 exposed by the gate lines 110, e.g., the areas of the contact regions 135, can be increased.

A plurality of contacts 142 are formed between the respective pairs of spacers 132b and are disposed on the impurity regions 124. The contacts 132 completely fill the empty spaces between the respective pairs of spacers 132b. The top surface of the contacts 132 is on a level with the top surface of the gate capping layer 116. That is, the contacts 142 are self-aligned with the respective pairs of spacers 132b of the gate lines 110. The contacts 142 are completely insulated from the gate capping layer 116, the barrier layers 132a, and the pairs of spacers 132b and are electrically connected to the impurity regions 124.

The structure of a semiconductor device according to an exemplary embodiment of the present invention will hereinafter be described in detail with reference to FIGS. 3, 4A and 4B.

Figure 3:
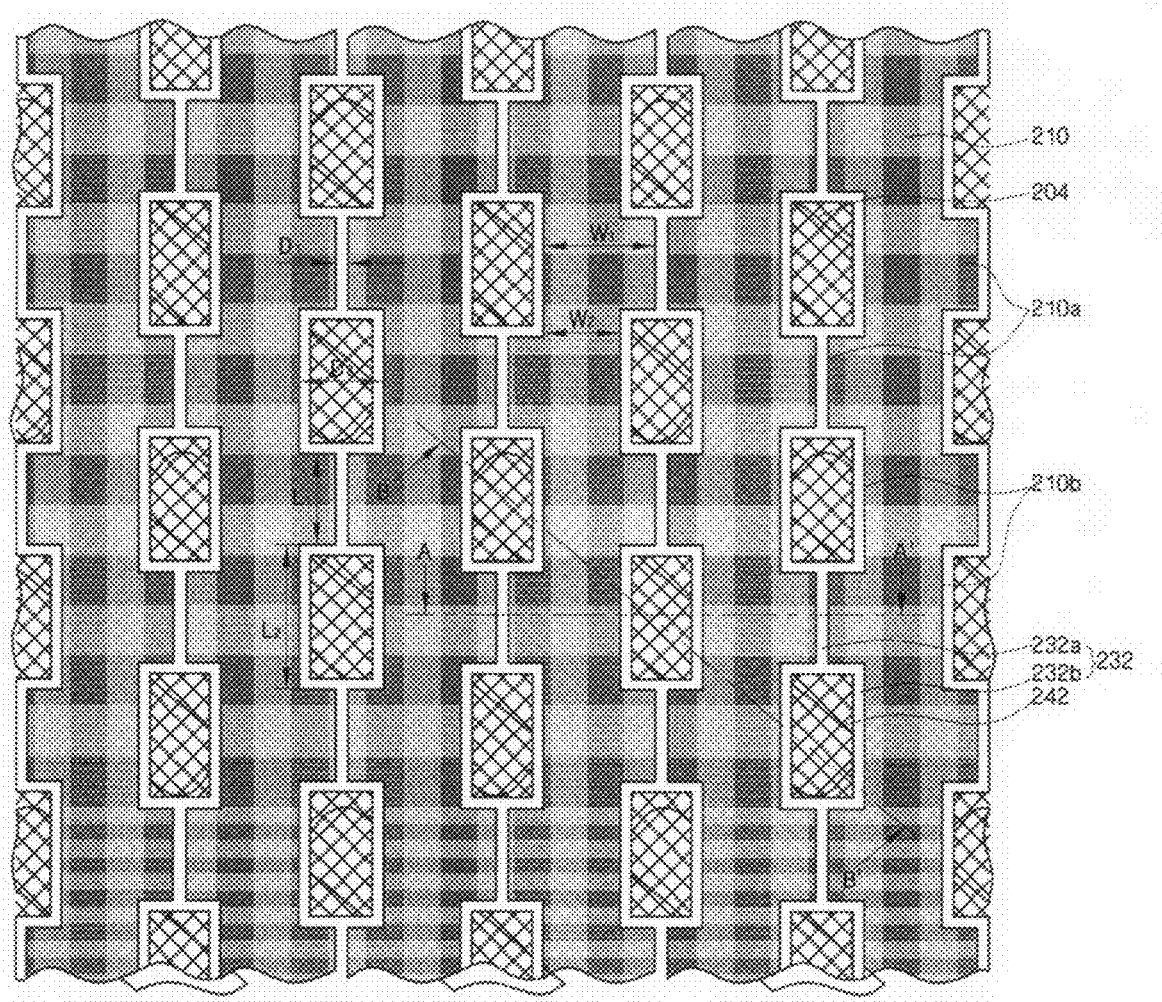
FIG. 3 illustrates a plan view of a semiconductor device according to an exemplary embodiment of the present invention.
Figure 4A:
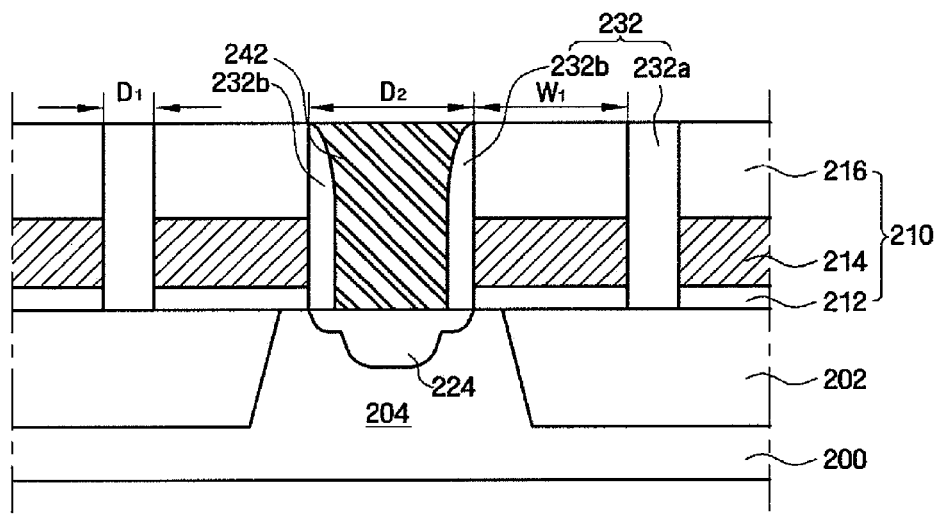
FIGS. 4A and 4B illustrate cross-sectional views taken along lines A-A' and B-B', respectively, of FIG. 3.
Figure 4B:
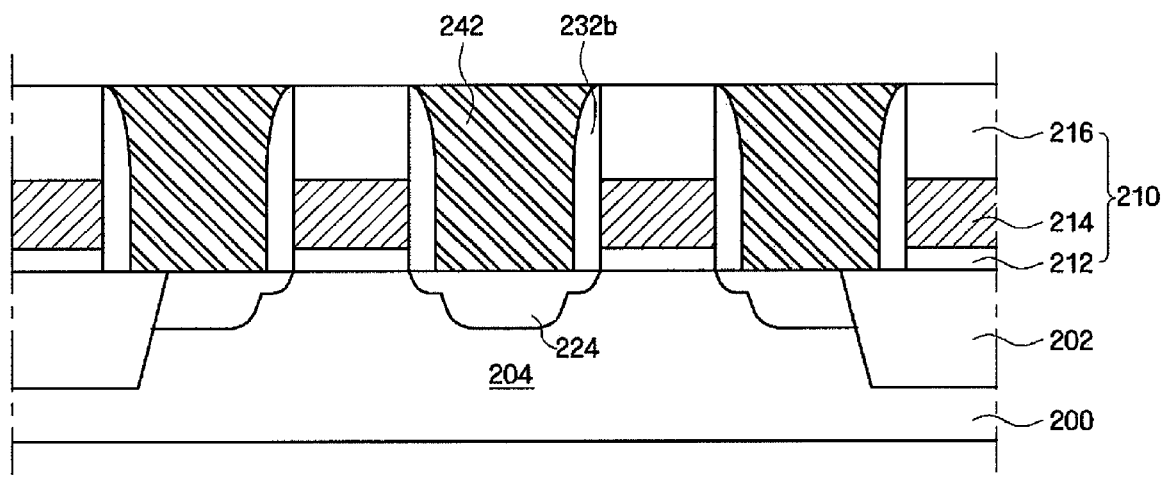

FIG. 3 illustrates a plan view of a semiconductor device according to another exemplary embodiment of the present invention, and FIGS. 4A and 4B illustrate cross-sectional views taken along lines A-A' and B-B', respectively, of FIG. 3. Referring to FIGS. 3, 4A and 4B, a plurality of active regions 204 are defined by an isolation layer 202. The active regions 204 may be, for example, bar-shaped and have a longitudinal axis and a latitudinal axis.

As the design rule of semiconductor devices decreases, the area of memory cell regions has rapidly decreased. To address this, the active regions 204 may be diagonal with respect to a longitudinal direction of a plurality of gate lines 210 which are formed on the semiconductor substrate 200. That is, the active regions may form, for example, a predetermined angle θ (where 0<θ<±90) with the longitudinal direction of the gate lines 210.

The gate lines 210 are formed on the semiconductor substrate 200 and extend across the active regions 204. Two gate lines 210 may extend across an active region 204.

A plurality of protrusions 210a and a plurality of recesses 210b are alternately formed on either side of each of the gate lines 210. Each of the gate lines 210 is asymmetrical with respect to the longitudinal direction of the gate lines 210b due to the protrusions 210a and the recesses 210b. That is, a plurality of protrusions 210a that are formed on one side of each of the gate lines 210 respectively correspond to a plurality of recesses 210b that are formed on the other side of a corresponding gate line 210. The protrusions 210a are disposed on the isolation layer 202, and the recesses 210b are disposed on the active regions 204.

The length $L_1$ of the protrusions 210a may be the same as or less than the length $L_2$ of the recesses 210b. If the length $L_1$ is the same as the length $L_2$, the width of the gate lines 210 may be uniform. That is, a first width $W_1$ of the gate lines 210 (e.g., the distance between a protrusion 210a and a recess 210b that are disposed on the opposite sides of a gate line 210) may be the same as a second width $W_1$ of the gate lines 210 (e.g., the distance between a pair of recesses 210b that are disposed on the opposite sides of a gate line 210). If the length $L_2$ is greater than the length $L_1$, the width of the gate lines 210 may not be uniform, e.g., the first width $W_1$ and the second width $W_2$ may be different.

The gate lines 210 are evenly spaced apart from one another so that the protrusions 210a or the recesses 210b of a gate line 210 can correspond to the respective protrusions 210a or the respective recesses 210b of an adjacent gate line 210. The active regions 204 in the semiconductor substrate 200 are partially exposed between the recesses 210b.

The distance between a pair of horizontally adjacent protrusions 210a, e.g., a first distance $D_1$, may be determined so that the empty space between the pair of horizontally adjacent protrusions 210a can be completely filled with an insulation layer 230 for spacers. The distance between a pair of horizontally adjacent recesses 210b, e.g., the second distance $D_2$, may be determined to be greater than the first distance $D_1$, thereby increasing the areas of the active regions 204 exposed by the recesses 210b.

Each of the gate lines 210 includes a gate insulation layer 212, a gate conductive layer 214 and a gate capping layer 216 that are sequentially deposited. Impurity regions 224 are formed in the active regions 204 on both sides of each of the gate lines 210. Therefore, the portions of the active regions 204 exposed between the recesses 210b may be the impurity regions 224.

An insulation layer 232 is formed on both sidewalls of each of the gate lines 210. The insulation layer 232 includes a plurality of barrier layers 232a that are disposed in the first regions between the protrusions 210a, and a plurality of pairs of spacers 232b that are disposed in the second regions between the recesses 210b.

For example, the barrier layers 232a are formed on the sidewalls of the protrusions 210a and completely fill the empty spaces between the protrusions 210a. The pairs of spacers 232b are formed on the sidewalls of the recesses 210b and are connected to the barrier layers 232a. The pairs of spacers 232b surround the sidewalls of the respective recesses 210b. The impurity regions 224 are exposed by the pairs of spacers 232b.

A plurality of contacts 242 are formed between the respective pairs of spacers 232b and cover the top surfaces of the impurity regions 224. The top surfaces of the contacts 242 are on a level with the top surfaces of the gate lines 210. The contacts 242 are completely insulated from the gate lines 210 by the gate capping layer 216, the barrier layers 232a and the pairs of spacers 232b. The contacts 242 are electrically connected to the impurity regions 224.

That is, the contacts 242 are self-aligned with the pairs of spacers 232b. The contacts 242 are disposed between the respective pairs of recesses 210b, and, thus, the contact areas between the contacts 242 and the impurity regions 224 can be increased.

A method of fabricating a semiconductor device according to an exemplary embodiment of the present invention will hereinafter be described in detail.

The method of fabricating the semiconductor device of the embodiment of FIGS. 1, 2A and 2B may be substantially the same as the method of fabricating the semiconductor device of the embodiment of FIGS. 3, 4A and 4B, except for the forming of the gate lines. Thus, only the method of fabricating the semiconductor device of the embodiment of FIGS. 3, 4A and 4B will hereinafter be described in detail with reference to FIGS. 5 through 10B.

FIGS. 5 through 10B illustrate plan views or cross-sectional views for explaining a method of fabricating a semiconductor device according to an exemplary embodiment of the present invention.

Figure 5:
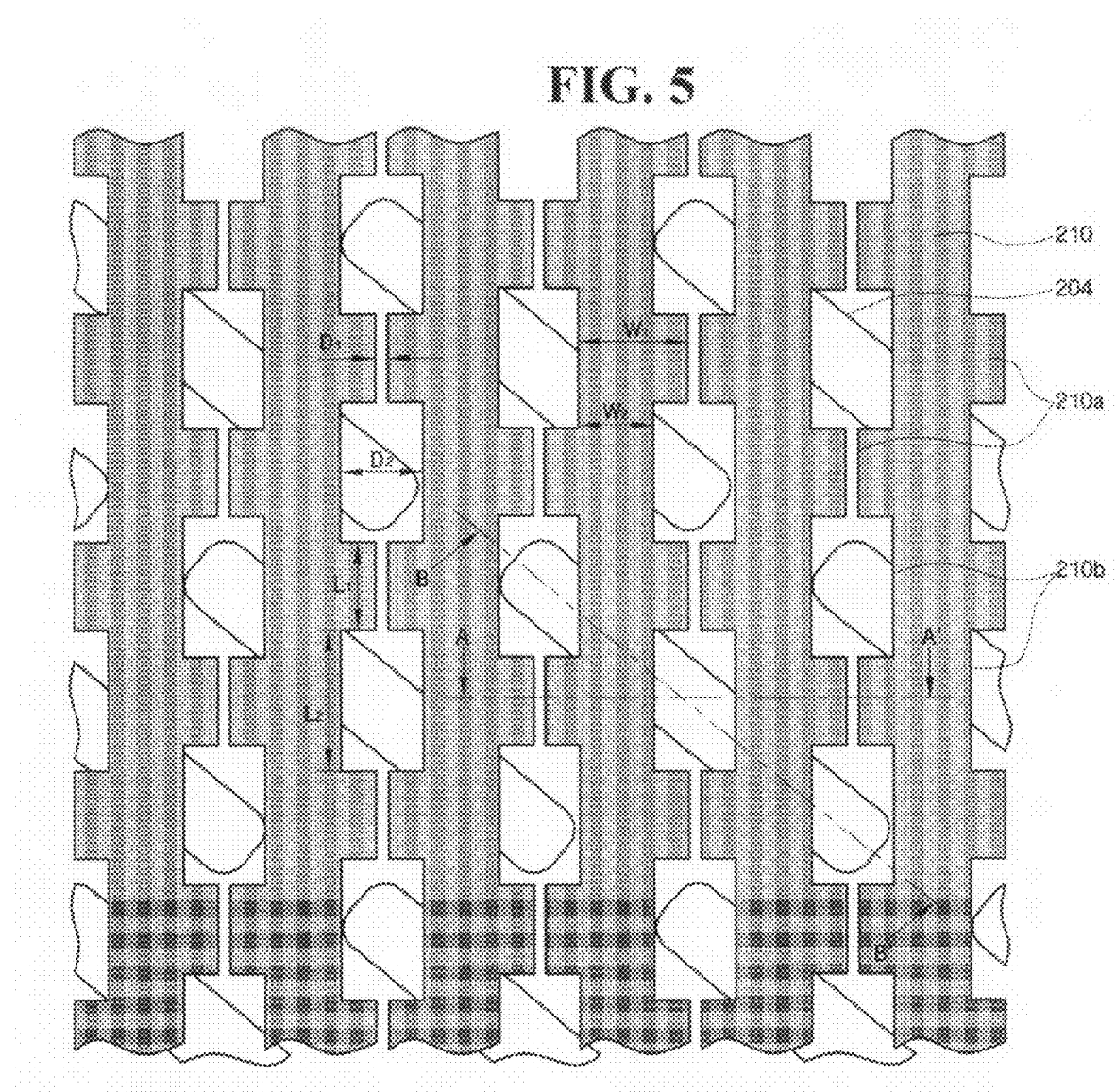
FIGS. 5 through 10B illustrate plan views or cross-sectional views for explaining a method of fabricating a semiconductor device according to an exemplary embodiment of the present invention.
Figure 6A:
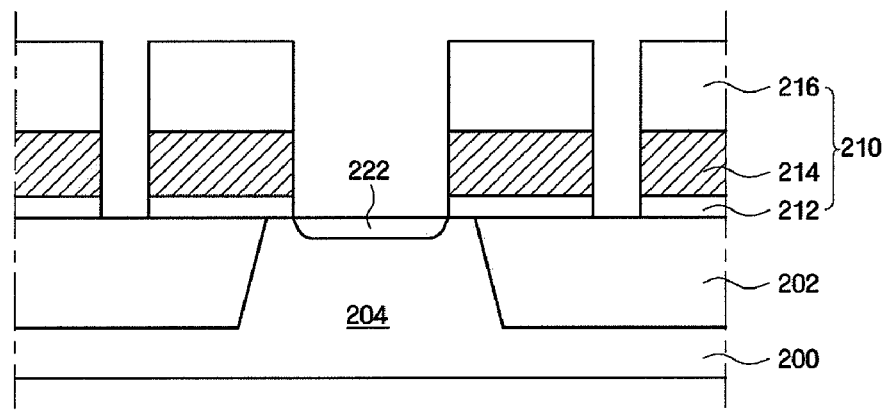
Figure 6B:
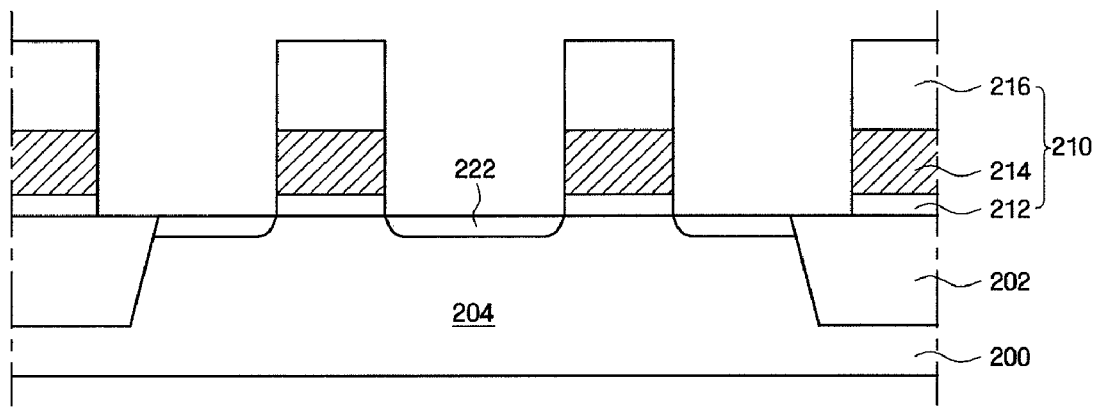

Referring to FIGS. 5, 6A and 6B, an isolation layer 202 is formed on a semiconductor substrate 200 using, for example, a local-oxidation-of-silicon (LOCOS) method or a shallow trench isolation (STI) method. The isolation layer 202 defines a plurality of active regions 204 as diagonal bars. Thereafter, a plurality of gate lines 210 are formed on the semiconductor substrate 200 and extend in a predetermined direction across the active regions 204. The active regions 204 may form, for example, a predetermined angle θ (where 0<θ<±90) with a longitudinal direction of the gate lines 210.

For example, a gate insulation layer 212 is thinly formed on the semiconductor substrate 200 using a thermal oxidation method or a chemical vapor deposition (CVD) method. Thereafter, a gate conductive layer 214 is formed on the gate insulation layer 212 by depositing a conductive material on the gate insulation layer 212. The gate conductive layer 214 may include, for example, a polysilicon layer doped with impurities, a polysilicide layer, which is the combination of a polysilicon layer and a metal silicide layer, or a metal layer. Thereafter, a gate capping layer 216 is formed on the gate insulation layer 214. The gate capping layer 216 may include, for example, a silicon nitride layer, which is an insulation layer.

Thereafter, a photoresist pattern is formed on the gate capping layer 216, and the gate capping layer 216 is patterned by, for example, performing anisotropic etching using the photoresist pattern as an etching mask. Thereafter, the gate lines 210 are formed by, for example, performing anisotropic etching on the gate insulation layer 212 and the gate conductive layer 214 using the patterned gate capping layer 216 as an etching mask.

The gate lines 210 may be formed through patterning so that a plurality of protrusions 210a and a plurality of recesses 210b can be alternately formed on either side of each of the gate lines 210. A pair of diagonally adjacent protrusions 210a that are disposed on opposite sides of a gate line 210 are asymmetrical with respect to the gate line 210. The protrusions 210a or the recesses 210b of a gate line 210 face the respective protrusions 210a or the respective recesses 210b of an adjacent gate line 210.

The length $L_1$ of the protrusions 210a may be the same as or less than the length $L_2$ of the recesses 210b. The protrusions 210a are disposed on the isolation layer 202, and the recesses 210b are disposed on the active regions 204. The distance between a pair of horizontally adjacent protrusions 210a, e.g., a first distance $D_1$, may be determined so that the empty space between the pair of horizontally adjacent protrusions 210a can be completely filled with an insulation layer (230 of FIGS. 5A and 5B) for spacers.

Thereafter, low-concentration impurity regions 222 are formed in the active regions 204 on both sides of each of the gate lines 210 by implanting impurity ions. That is, the low-concentration impurity regions 222 are exposed between respective corresponding pairs of recesses 210b. In the present exemplary embodiment, the low-concentration impurity regions 222 are formed after the formation of the gate lines 210, but the present invention is not restricted to this. That is, high-concentration impurity regions may be formed after the formation of the gate lines 210.

Figure 7A:
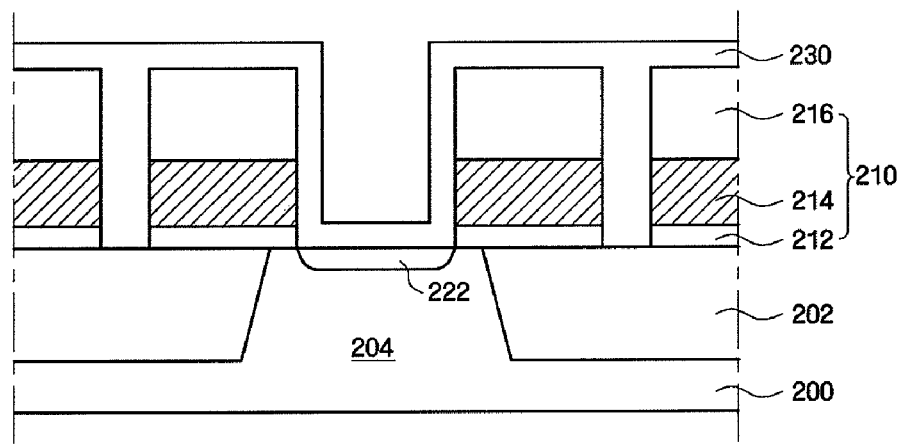
Figure 7B:
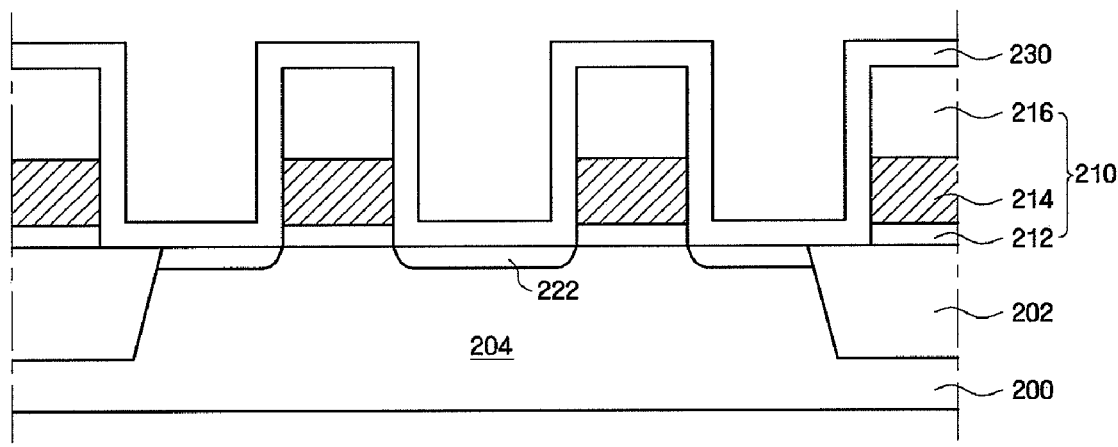

Referring to FIGS. 7A and 7B, an insulation layer 230 for spacers are conformally formed on the semiconductor substrate 200 and on the gate lines 210. The insulation layer 230 may include, for example, a silicon nitride layer or a silicon oxide layer for insulating the gate conductive layer 214. The insulation layer 230 may be deposited to such a thickness that the empty spaces between the protrusions 210a can be completely filled with the insulation layer 230.

As the distance between the pair of horizontally adjacent protrusions 210a, e.g., the first distance $D_1$, is relatively small, the insulation layer 230 can completely fill the empty spaces between the gate lines 210. As the distance between the pair of horizontally adjacent recesses 210b, e.g., the second distance $D_2$, is relatively large, the insulation layer 230 covers the surfaces of the low-concentration impurity regions 222 and the sidewalls of the recesses 210b.

Figure 8:
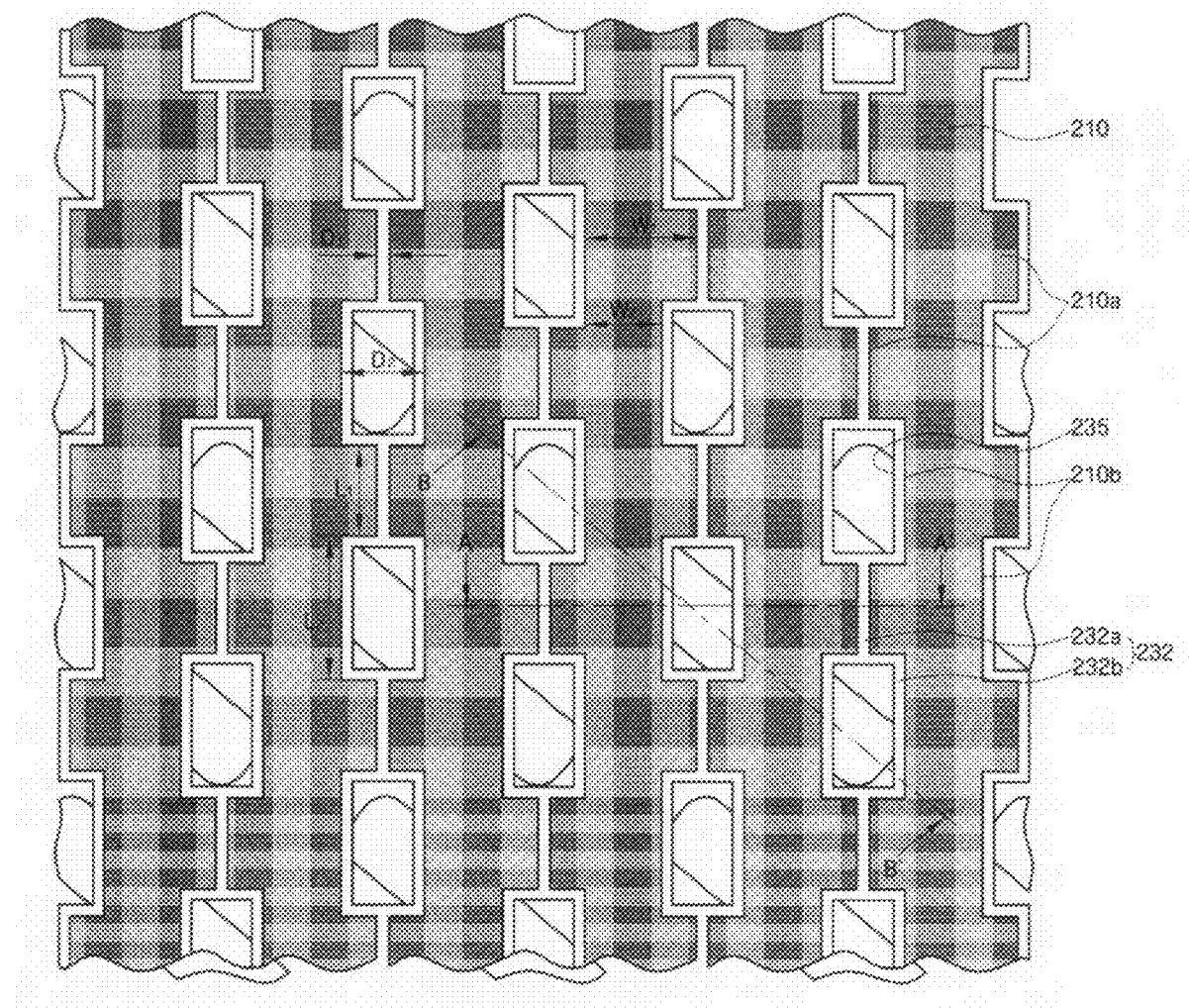
Figure 9A:
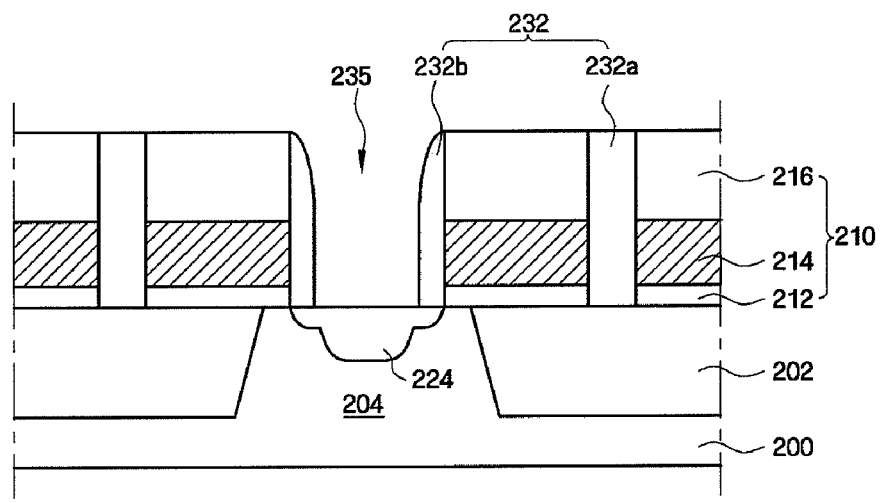
Figure 9B:
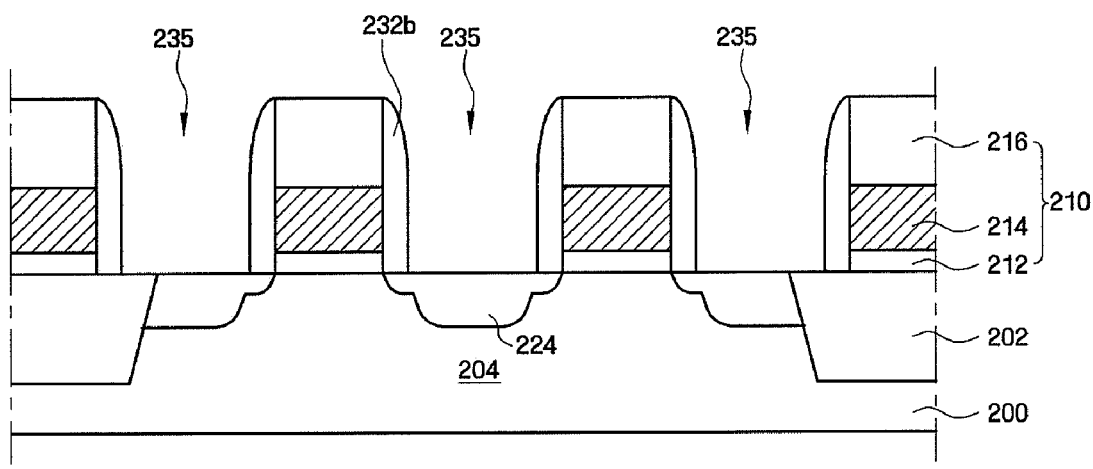

Referring to FIGS. 8, 9A and 9B, a plurality of barrier layers 232a and a plurality of pairs of spacers 232b are formed by, for example, performing anisotropic etching on the insulation layer 230. The barrier layers 232a are disposed between respective corresponding pairs of horizontally adjacent protrusions 210a, and the pairs of spacers 232b are disposed between respective corresponding pairs of horizontally adjacent recesses 232b.

For example, an etch-back operation is performed on the insulation layer 230, thereby exposing the top surface of the gate capping layer 216, forming a plurality of barrier layers 232a that completely fill the empty spaces between the protrusions 210a, and forming a plurality of pairs of spacers 232b on the sidewalls of the recesses 210b. The pairs of spacers 232b expose the low-concentration impurity regions 222, and are connected to the barrier layers 232a, thereby defining a plurality of contact regions 135 that expose the respective low-concentration impurity regions 222.

In this manner, it is possible to form a plurality of self-aligned contact holes that are insulated from one another without the requirement of an addition process for defining the contact regions 135 simply by forming the pairs of spacers 232b on the sidewalls of each of the gate lines 210.

Thereafter, a plurality of high-concentration impurity regions 224 are formed by implanting high-concentration impurity ions into portions of the active regions 204 exposed by the pairs of spacers 232b.

Figure 10A:
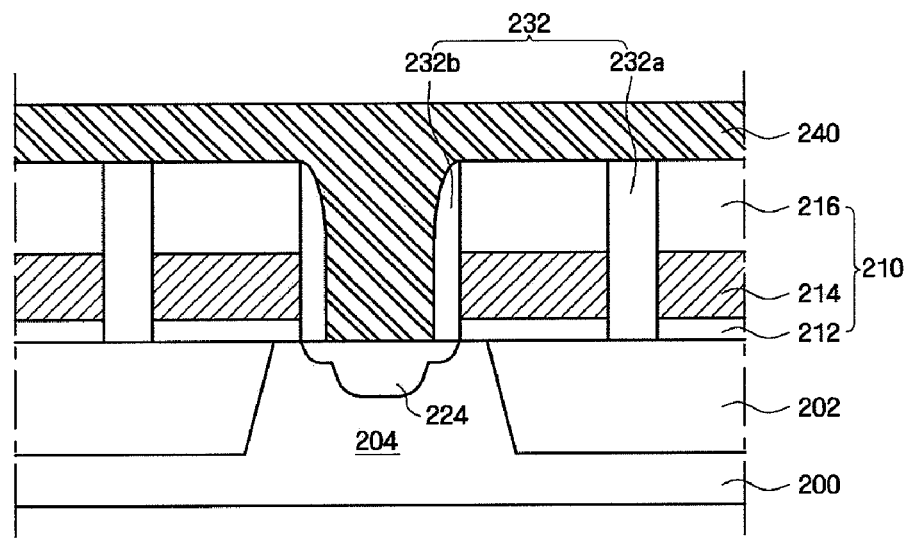
Figure 10B:
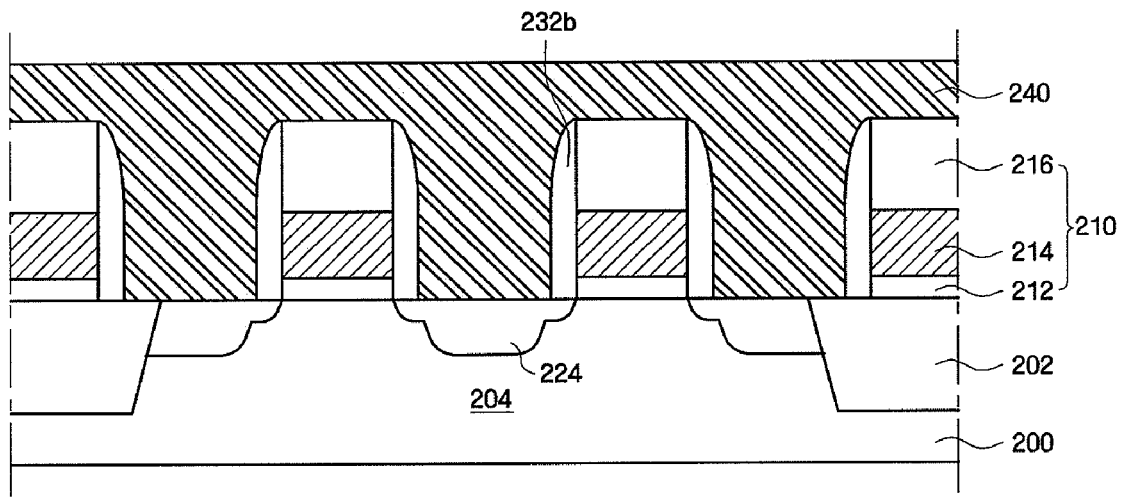

Thereafter, referring to FIGS. 10A and 10B, a conductive layer 240 for forming contacts is deposited on the semiconductor substrate 200 on which the gate lines 210, the barrier layers 232a and the pairs of spacers 232b are formed. The conductive layer 240 may include, for example, a polysilicon layer or a metal layer. The conductive layer 240 may be deposited to such a thickness that the contact regions 135 can be sufficiently filled with the conductive layer 240.

Thereafter, a plurality of self-aligned contacts 242 are formed by planarizing the conductive layer 240 until the top surface of the gate capping layer 216 is exposed, as illustrated in FIGS. 3, 4A and 4B. The conductive layer 240 may be planarized using, for example, a chemical mechanical polishing (CMP) method or an etch-back method.

The contacts 242 are insulated from the gate lines 210 by the gate capping layer 216, the barrier layers 232a, and the pairs of spacers 232b and are also insulated from one another.

In the present exemplary embodiment, the contacts 242 can be formed without the requirement of a process for exposing the impurity regions 224 by, for example, depositing an insulation layer and forming a plurality of contact holes in the insulation layer. Therefore, it is possible to simplify the fabrication of a semiconductor device.

According to exemplary embodiments of the present invention, a plurality of gate lines are formed as zigzag lines and are symmetrically arranged. Thus, it is possible to increase the areas of contact regions, which expose impurity regions.

According to exemplary embodiments of the present invention, a plurality of active regions are formed diagonally with respect to a longitudinal direction of the gate lines so that the gate lines can perpendicularly intersect the active regions. Thus, it is possible to prevent the probability of sharp portions being generated in channel regions below the gate lines. In addition, it is possible to prevent an electromagnetic field from being concentrated in sharp portions in channel regions, and thus prevent an increase in leakage current.

According to exemplary embodiments of the present invention, an insulation layer for spacers is formed so that the empty spaces between a plurality of gate lines, and, particularly, between a plurality of pairs of horizontally adjacent protrusions of the gate lines, can be completely filled with the insulation layer. Thus, it is possible to completely insulate the gate lines from one another using a plurality of barrier layers and a plurality of pairs of spacers. As a result, it is possible to define a plurality of contact regions using the pairs of spacers.

According to exemplary embodiments of the present invention, a plurality of gate lines are insulated from one another by a plurality of pairs of spacers and a plurality of barrier layers, and a plurality of contact regions, which expose impurity regions, are defined by the pairs of spacers. Thus, there is no need to perform an additional patterning operation for forming a plurality of contacts.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
    a plurality of active regions which are defined in a semiconductor substrate;
    a plurality of gate lines which are formed as zigzag lines, extend across the active regions, are symmetrically arranged, and define a plurality of first regions and a plurality of second regions therebetween, wherein the first regions are narrower than the second regions;
    an insulation layer which defines a plurality of contact regions by completely filling empty spaces in the first regions between the gate lines and, extending from the first regions, and surrounding sidewalls of portions of the gate lines in the second regions, wherein the contact regions partially expose the active regions; and
    a plurality of contacts which respectively fill the contact regions.

2. The semiconductor device as claimed in claim 1, wherein the active regions are diagonal with respect to a longitudinal direction of the gate lines.

3. The semiconductor device as claimed in claim 1, wherein each of the gate lines comprises a conductive layer and a capping layer that are sequentially deposited.

4. The semiconductor device as claimed in claim 1, wherein the first regions are disposed on an area of the semiconductor substrate, other than on the active regions.

5. The semiconductor device as claimed in claim 1, wherein a width of at least one of the contact regions is greater than a width of at least another of the contact regions.

6. A semiconductor device comprising:
    a plurality of active regions which are defined in a semiconductor substrate;
    a plurality of gate lines which extend across the active regions, each of the gate lines comprising a plurality of protrusions and a plurality of recesses that are alternately formed on either side of a corresponding gate line, and are asymmetrical with respect to a longitudinal direction of the gate lines, wherein at least one of the protrusions or the recesses of a gate line corresponds to at least one of the respective protrusions or the respective recesses of an adjacent gate line;
    an insulation layer which is formed on sidewalls of each of the gate lines and comprises first portions that completely fill empty spaces between the protrusions and second portions that define a plurality of contact regions by extending from the first portions, surrounding sidewalls of the recesses, and partially exposing the active regions; and
    a plurality of contacts which respectively fill the contact regions.

7. The semiconductor device as claimed in claim 6, wherein the active regions are diagonal with respect to the longitudinal direction of the gate lines.

8. The semiconductor device as claimed in claim 6, wherein each of the gate lines comprises a conductive layer and a capping layer that are sequentially deposited on the semiconductor substrate.

9. The semiconductor device as claimed in claim 6, wherein the length of the recesses is the same as the length of the protrusions.

10. The semiconductor device as claimed in claim 6, wherein the length of the recesses is greater than the length of the protrusions.

11. A method of fabricating a semiconductor device, comprising:
    defining a plurality of active regions in a semiconductor substrate;
    forming a plurality of gate lines as zigzag lines, the gate lines extending across the active regions, being symmetrically arranged and defining first regions and second regions therebetween, wherein the first regions are narrower than the second regions;
    forming an insulation layer which defines a plurality of contact regions by completely filling empty spaces in the first regions between the gate lines and, extending from the first regions, and surrounding sidewalls of portions of the gate lines in the second regions, wherein the contact regions partially expose the active regions; and
    forming a plurality of contacts so that the contact regions are filled with the respective contacts.

12. The method as claimed in claim 11, wherein the active regions are diagonal with respect to the longitudinal direction of the gate lines.

13. The method as claimed in claim 11, wherein the forming of the gate lines comprises sequentially depositing a conductive layer and a capping layer on the semiconductor substrate.

14. The method as claimed in claim 11, wherein the first regions are disposed on an area of the semiconductor substrate, other than on the active regions.

15. The method as claimed in claim 11, wherein a width of at least one of the contact regions is greater than a width of at least one of the other contact regions.

16. The method as claimed in claim 11, wherein the forming of the insulation layer comprises:

conformally depositing an insulation layer for spacers on the semiconductor substrate and on the gate lines; and performing anisotropic etching on the insulation layer for spacers until the semiconductor substrate is exposed.

17. The method as claimed in claim 16, wherein the forming of the insulation layer for spacers comprises forming the insulation layer for spacers to such a thickness that the first regions between the gate lines are filled with the insulation layer for spacers.

* * * * *